United States Patent
Lee et al.

(10) Patent No.: US 8,890,282 B2
(45) Date of Patent: Nov. 18, 2014

(54) INTEGRATED CIRCUIT DEVICES INCLUDING THROUGH-SILICON VIA (TSV) CONTACT PADS ELECTRONICALLY INSULATED FROM A SUBSTRATE

(71) Applicant: Samsung Electronics Co., Ltd., Suwon-si (KR)

(72) Inventors: Woon-Seob Lee, Suwon-si (KR); Sin-Woo Kang, Suwon-si (KR); Ki-Young Yun, Suwon-si (KR); Sung-Dong Cho, Hwaseong-si (KR); Eun-Ji Kim, Seoul (KR); Yeong-Lyeol Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/013,086

(22) Filed: Aug. 29, 2013

(65) Prior Publication Data

US 2014/0124951 A1    May 8, 2014

(30) Foreign Application Priority Data

Nov. 6, 2012  (KR) ........................ 10-2012-0124977

(51) Int. Cl.
  *H01L 21/70*  (2006.01)
  *H01L 23/48*  (2006.01)

(52) U.S. Cl.
  CPC .................................... *H01L 23/481* (2013.01)
  USPC .......................................... 257/508; 257/506

(58) Field of Classification Search
  USPC ................................................ 257/506, 508
  See application file for complete search history.

(56) References Cited

U.S. PATENT DOCUMENTS

| | | | |
|---|---|---|---|
| 6,277,708 B1 * | 8/2001 | Bothra et al. | 438/430 |
| 7,888,738 B2 * | 2/2011 | Tessier et al. | 257/347 |
| 7,999,320 B2 * | 8/2011 | Botula et al. | 257/347 |
| 8,039,356 B2 | 10/2011 | Herrin et al. | |
| 8,358,012 B2 * | 1/2013 | Haran et al. | 257/774 |
| 2009/0001466 A1 * | 1/2009 | Yang et al. | 257/347 |
| 2010/0201440 A1 * | 8/2010 | Nowak | 327/581 |
| 2011/0186990 A1 | 8/2011 | Mawatari et al. | |
| 2011/0198747 A1 | 8/2011 | Kuo et al. | |
| 2011/0221510 A1 * | 9/2011 | Botula et al. | 327/534 |
| 2011/0249483 A1 | 10/2011 | Oh et al. | |
| 2012/0036489 A1 | 2/2012 | Wang et al. | |
| 2013/0171796 A1 * | 7/2013 | Anderson et al. | 438/311 |
| 2013/0240998 A1 * | 9/2013 | Cheng et al. | 257/369 |
| 2013/0264676 A1 * | 10/2013 | Yang et al. | 257/508 |

FOREIGN PATENT DOCUMENTS

JP   2012-028557   2/2012
JP   2012-028695   2/2012

* cited by examiner

*Primary Examiner* — Ngan Ngo
(74) *Attorney, Agent, or Firm* — Myers Bigel Sibley & Sajovec, PA

(57) ABSTRACT

An integrated circuit device includes a substrate having a plurality of device patterns thereon. A device isolation layer is provided on the substrate, an interlayer dielectric layer is provided on the device isolation layer and the substrate, and a conductive via extends through the interlayer dielectric layer and the device isolation layer and into the substrate. A conductive via contact pad is provided on the interlayer dielectric layer in electrical contact with the conductive via. In plan view, the conductive via contact pad is confined within an area of the interlayer dielectric layer and/or an area of the device isolation layer that electrically insulates the conductive via contact pad from the substrate. Related methods and devices are also discussed.

20 Claims, 11 Drawing Sheets

US 8,890,282 B2

INTEGRATED CIRCUIT DEVICES INCLUDING THROUGH-SILICON VIA (TSV) CONTACT PADS ELECTRONICALLY INSULATED FROM A SUBSTRATE

CROSS-REFERENCE TO RELATED APPLICATION

This application claims priority under 35 U.S.C. 119 from Korean Patent Application No. 10-2012-0124977 filed on Nov. 6, 2012 in the Korean Intellectual Property Office, the disclosure of which is incorporated by reference herein in its entirety.

BACKGROUND

The present inventive concept relates to integrated circuit devices, and in particular, to integrated circuit devices including conductive vias.

As semiconductor devices have become more highly integrated and require increasingly higher capacities, three-dimensional (3D) packaging techniques (in which various individual chips are stacked) have been developed. Specifically, packaging techniques in which a via hole penetrating a substrate is formed and an electrode is formed in the via hole (also referred to as through silicon via contact techniques) may be used to augment and/or replace wire bonding techniques. However, as several thousand or more through silicon via contacts may be formed per chip, leakage current may occur due to the through silicon via contacts.

SUMMARY

The present inventive concept provides a semiconductor device having improved reliability by eliminating a leakage current path between through silicon via pads contacting a substrate and a through silicon via.

The above and other objects of the present inventive concept will be described in or be apparent from the following description of particular embodiments.

According to an aspect of the present inventive concept, an integrated circuit device includes a substrate having a plurality of device patterns thereon, a device isolation layer on the substrate, and an interlayer dielectric layer on the device isolation layer and the substrate. A conductive via extends through the interlayer dielectric layer and the device isolation layer and into the substrate. A conductive via contact pad extends on the conductive via and the interlayer dielectric layer. In plan view, the conductive via contact pad is confined within an area of the interlayer dielectric layer and/or an area of the device isolation layer that electrically insulates the conductive via contact pad from the substrate.

In some embodiments, the device patterns may be first dummy device patterns in an electrically floating state in the interlayer dielectric layer adjacent a periphery of the conductive via contact pad, and the area of the interlayer dielectric layer may be free of the first dummy device patterns.

In some embodiments, the area of the interlayer dielectric layer may include at least one second dummy device pattern therein. The second dummy device pattern may be electrically insulated from the substrate by the area of the device isolation layer therebetween.

In some embodiments, the area of the device isolation layer may include at least one dummy source/drain region of the substrate protruding therethrough. The dummy source/drain region may be electrically insulated from the conductive via contact pad by the area of the interlayer dielectric layer therebetween.

In some embodiments, a surface of the conductive via contact pad on the conductive via and the interlayer dielectric layer may be non-planar.

According to another aspect of the present inventive concept, there is provided a semiconductor device including a substrate, a device isolation film formed in the substrate, a first dummy device pattern formed on the substrate and arranged in a vicinity or adjacent a periphery of the device isolation film, an interlayer dielectric film covering the device isolation film and the first dummy device pattern, a through silicon via (TSV) formed through the substrate, the device isolation film and the interlayer dielectric film, and a through silicon via pad formed on the interlayer dielectric film and contacting the through silicon via, the through silicon via pad having a width smaller than that of the device isolation film.

According to still another aspect of the present inventive concept, there is provided a semiconductor device including a substrate, a device isolation film formed in the substrate, a dummy device pattern formed on the substrate and arranged in a vicinity or adjacent a periphery of the device isolation film, an interlayer dielectric film covering the device isolation film and the dummy device pattern, and a through silicon via (TSV) formed through the substrate, the device isolation film and the interlayer dielectric film, wherein the dummy device pattern does not overlap the through silicon via pad, and the dummy device pattern protruding from the substrate and the device isolation film is not formed under or directly below the through silicon via pad.

BRIEF DESCRIPTION OF THE DRAWINGS

The above and other features and advantages of the present inventive concept will become more apparent by describing in detail embodiments thereof with reference to the attached drawings in which.

DETAILED DESCRIPTION OF EMBODIMENTS

Figure 1:
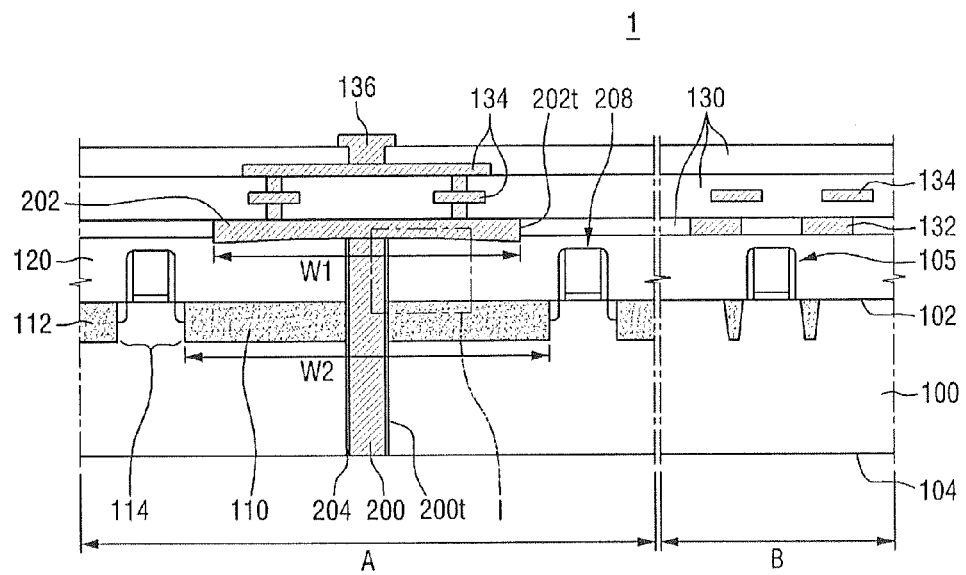
FIG. 1 is a cross-sectional view illustrating a semiconductor device according to some embodiments of the present inventive concept.

The present inventive concept will now be described more fully hereinafter with reference to the accompanying drawings, in which preferred embodiments of the inventive concept are shown. This inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. The same reference numbers indicate the same components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein, but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
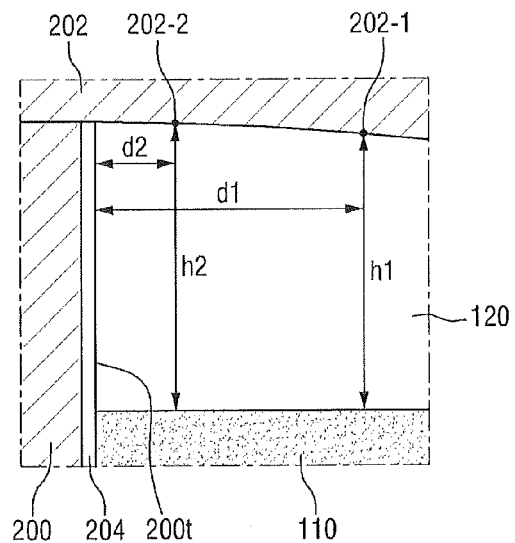
FIG. 2 is an enlarged cross-sectional view of a portion I of FIG. 1.
Figure 3A:
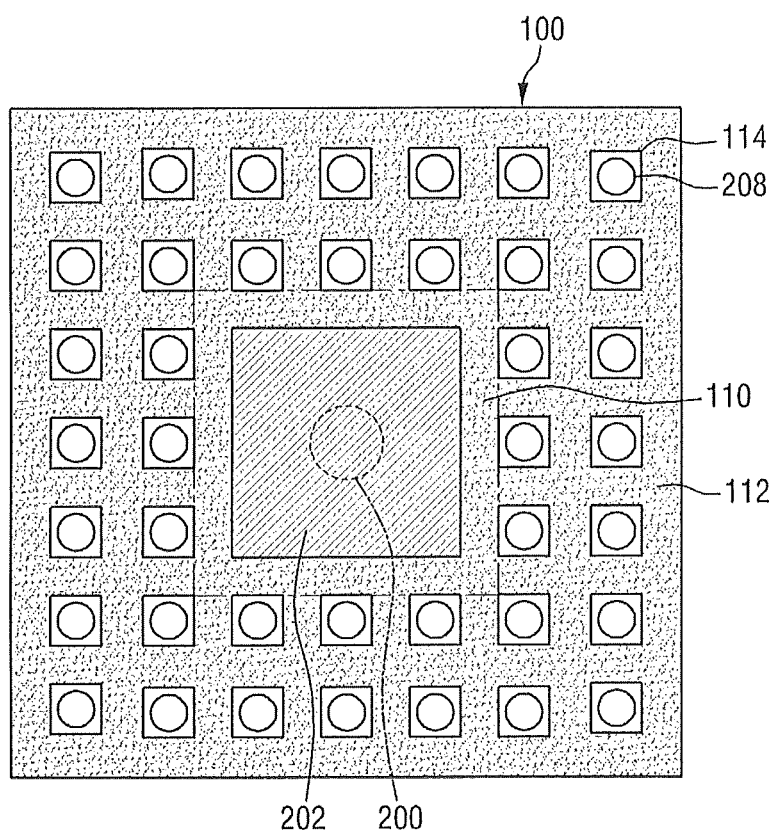
FIG. 3A is a layout or plan view of a first region (A) of FIG. 1, in which a through via pad has a plate shape.
Figure 3B:
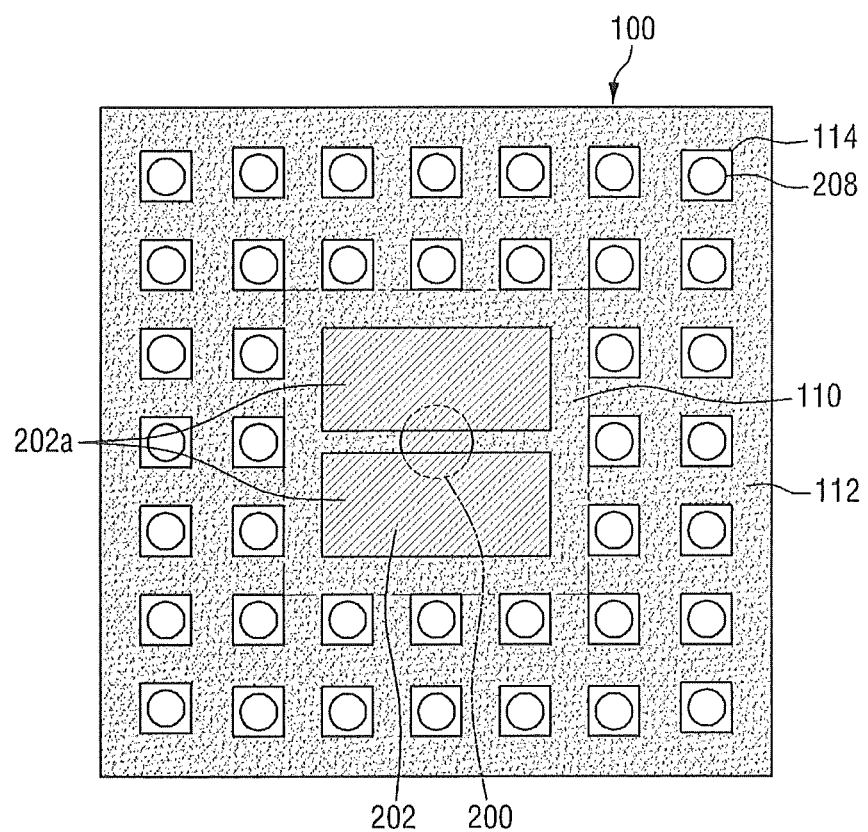
FIG. 3B is a layout or plan view of the first region (A) of FIG. 1, in which a through via pad has a line shape.

Hereinafter, an integrated circuit device according to some embodiments of the present inventive concept will be described with reference to FIGS. 1 to 3B. FIG. 1 is a cross-sectional view illustrating a semiconductor device according to some embodiments of the present inventive concept, FIG. 2 is an enlarged cross-sectional view of a portion I of FIG. 1, FIG. 3A is a layout or plan view of a first region (A) of FIG. 1, in which a through via pad has a plate shape, and FIG. 3B is a layout or plan view of the first region (A) of FIG. 1, in which a through via pad has a line or linear shape.

Referring to FIG. 1, the semiconductor device 1 includes a substrate 100, a first device isolation layer or film 110, first dummy device patterns 208, an interlayer dielectric layer or film 120, a conductive via (illustrated as a first through silicon via) 200 and a conductive via contact pad (illustrated as a first through silicon via pad) 202.

The substrate 100 may include a first region A and a second region B. The first region A may be, for example, a peripheral region. The second region B may be, for example, a device region, in which circuit patterns 105 performing functions of the semiconductor device 1 are formed.

The substrate 100 may have a first surface 102 and a second surface 104. The first surface 102 and the second surface 104 may oppose each other. For example, the first surface 102 and the second surface 104 may be front and rear surfaces of the substrate 100. The substrate 100 may be, for example, a silicon-on-insulator (SOI), a gallium arsenide substrate, a silicon germanium substrate, a ceramic substrate, a quartz substrate, and/or a glass substrate for display. The second surface 104 of the substrate 100 may be provided after being polished to a predetermined thickness.

The circuit patterns 105 may be formed on the second region B. The circuit patterns 105 may be formed on the first surface 102 of the substrate 100. The circuit patterns 105 may include a transistor, a diode, a capacitor, and/or other active or passive electrical components. The circuit patterns 105 may constitute circuit devices. Therefore, the semiconductor device 1 may be a semiconductor chip having a plurality of circuit devices formed therein.

The circuit devices may include a plurality of memory devices. The memory devices may include, for example, volatile semiconductor memories and/or nonvolatile semiconductor memories. The volatile semiconductor memory may include, for example, DRAM, SRAM, etc. and the nonvolatile semiconductor memory may include, for example, EPROM, EEPROM, Flash EEPROM, etc.

The first device isolation film 110 may be formed in the first region A. The first device isolation film 110 may be formed on the substrate 100, for example, on first surface 102 of the substrate 100. The first device isolation film 110 may have, for example, a shallow trench isolation (STI) structure. A top surface of the first device isolation film 110 may be on the same plane as (i.e., coplanar with) the first surface 102 of the substrate 100, but aspects of the present inventive concept are not limited thereto. The top surface of the device isolation film 110 may be elevated or recessed from (i.e., non-coplanar with) the first surface 102 of the substrate 100. In the description of the embodiments of the present inventive concept, the top surface of the device isolation film 110 is referred to as being on the same plane as the first surface 102 of the substrate 100.

The first device isolation film 110 may be made of an insulating material, for example, a silicon oxide film. In addition, the first device isolation film 110 may be formed by various methods according to the design rule of a semiconductor device, including, ozone-tetra ortho silicate glass (TEOS), atmospheric pressure chemical vapor deposition (APCVD), plasma enhanced chemical vapor deposition (PECVD) and/or high density plasma chemical vapor deposition (HDP CVD).

A second device isolation film 112 may be formed around the first device isolation film 110. Since a description of the second device isolation film 112 may be substantially the same as that of the first device isolation film 110, a detailed description thereof will be omitted. In FIG. 1, the first device isolation film 110 and the second device isolation film 112 are spaced apart from each other. However, the first device isolation film 110 and the second device isolation film 112 may also be connected to each other, which will later be described in detail with reference to FIG. 3A.

First dummy source and drain regions 114 may be formed between the first device isolation film 110 and the second device isolation film 112. Impurities (different from or having an opposite conductivity type than impurities doped into the substrate 100) are doped into the first dummy source and drain regions 114, thereby forming a source and drain. The first source and drain regions 114 are regions not overlapping the first through silicon via pad 202.

The first dummy device patterns 208 may be formed on the first region A of the substrate 100 and may be arranged in vicinity or adjacent a periphery of the first device isolation film 110. In detail, the first dummy device patterns 208 may be formed on the first dummy source and drain regions 114.

The first dummy device patterns 208 may be in an electrically floating state, so that power is not supplied from an external power supply. In the description of some embodiments of the present inventive concept, the first dummy device patterns 208 are referred to as being a gate pattern of a transistor, but aspects of the present inventive concept are not limited thereto.

The interlayer dielectric film 120 may be formed on the first surface 102 of the substrate 100. The interlayer dielectric film 120 may be formed to cover the first device isolation film 110, the first dummy device patterns 208 and the circuit patterns 105. The interlayer dielectric film 120 may be, for example, a pre metal dielectric (PMD) film.

The interlayer dielectric film 120 may be formed using a low-k dielectric material, for example, FOX, TOSZ, USG, BSG, PSG, BPSG, PRTEOS, FSG, HDP, PEOX, FCVD or combinations thereof.

The first through silicon via 200 may be formed on the first region A of the substrate 100. The first through silicon via 200 may be formed to penetrate the substrate 100, the first device isolation film 110 and the interlayer dielectric film 120. The first through silicon via 200 may be exposed from the second surface 104 of the substrate 100. In other words, the first through silicon via 200 may be formed in and/or extend through a first throughhole 200t. The first throughhole 200t may be a hole formed after successively penetrating the substrate 100, the first device isolation film 110 and the interlayer dielectric film 120. Sidewalls of the first throughhole 200t may vertically penetrate the substrate 100, the interlayer dielectric film 120 and the device isolation film 110, but aspects of the present inventive concept are not limited thereto. That is to say, the sidewalls of the first throughhole 200t may have a slope or may be tapered. The first throughhole 200t may have widths gradually increasing from the second surface 104 of the substrate 100 to the top surface of the interlayer dielectric film 120.

The first through silicon via 200 may include, for example, copper (Cu) or tungsten (W). In the description of some embodiments of the present inventive concept, the first through silicon via 200 will be described as being made of copper having low resistance.

A first liner 204 may be arranged between the first through silicon via 200 and the substrate 100. In detail, the first liner 204 may be formed along the sidewalls of the first throughhole 200t. The first liner 204 may insulate the substrate 100 and the first through silicon via 200 from each other.

The first liner 204 may be formed using a low-k dielectric silicon oxide film or a carbon doped silicon oxide film. For example, the first liner 204 may be formed of a film having a good step coverage characteristic, such as, a TEOS film, an ozone-TEOS film, and/or an undoped silicate glass (USG) film.

A barrier film may be interposed between the first liner 204 and the first through silicon via 200. The barrier film may include, for example, Ta, TaN, Ti, TiN, Ru, Co, Ni, NiB, WN, or the like. The barrier film may have a single layered structure or a stacked structure of two or more layers.

The first through silicon via pad 202 may be formed in the first region A of the substrate 100. The first through silicon via pad 202 may be formed on the interlayer dielectric film 120. The first through silicon via pad 202 may be formed in contact with the first through silicon via 200. A portion of the first through silicon via pad 202 may be recessed into the interlayer dielectric film 120, which will be described in detail with reference to FIG. 2.

The first through silicon via pad 202 may be a conductive pad having a plate shape, but aspects of the present inventive concept are not limited thereto. That is to say, the first through silicon via pad 202 may be a conductive interconnection. The first through silicon via pad 202 may be made of the same material as the first through silicon via 200, for example, copper. If the first through silicon via pad 202 and the first through silicon via 200 are made of different materials, a metal barrier film may further be formed between the first through silicon via pad 202 and the first through silicon via 200.

The bottommost metal interconnection 132 may be formed on the interlayer dielectric film 120. The bottommost metal interconnection 132 formed on the circuit patterns 105 may be a metal interconnection exchanging electrical signals with respect to the circuit patterns 105. The bottommost metal interconnection 132 may be formed at the same level as the first through silicon via pad 202. Here, when an element or layer is referred to as being at "the same level" as another element or layer, it can be formed by the same fabricating process as the other element or layer. That is to say, the bottommost metal interconnection 132 and the first through silicon via pad 202 can be simultaneously formed by the same metallization process.

The first through silicon via pad 202 and the bottommost metal interconnection 132 may be formed in the inter-metal insulation film 130. The first through silicon via pad 202 may be formed at the same level as the bottommost metal interconnection 132 but may not be directly connected to the bottommost metal interconnection 132. Rather, the first through silicon via pad 202 and the bottommost metal interconnection 132 may be spatially separated from each other. The first through silicon via pad 202 and the bottommost metal interconnection 132 may be spatially separated from each other by the inter-metal insulation film 130 formed directly on the interlayer dielectric film 120 but may be electrically insulated from each other. However, the first through silicon via pad 202 and the bottommost metal interconnection 132 may be electrically connected to each other by an upper metal interconnection 134 formed to be higher than the bottommost metal interconnection 132.

In FIG. 1, the first through silicon via pad 202 is not connected to the bottommost metal interconnection 132, but aspects of the present inventive concept are not limited thereto. If the circuit pattern 105 is an electro-static discharge (ESD) preventing circuit, the first through silicon via pad 202 may be connected to the bottommost metal interconnection 132 at the same level to be electrically connected thereto.

The conductive pad 136 may be formed on the inter-metal insulation film 130. The conductive pad 136 may be used as an input/output terminal of the semiconductor device 1. The number or quantity of conductive pads 136 are illustrated by way of example and may be appropriately selected according to the kind and capacity of the semiconductor device. The conductive pad 136 may be connected to the first through silicon via pad 202 through a portion of the upper metal interconnection 134. Further, although not shown, the conductive pad 136 may be connected to the circuit patterns 105 through another portion of the upper metal interconnection 134. Accordingly, signals of the circuit patterns 105 may be transmitted to the conductive pad 136 through the bottommost metal interconnection 132 and a portion of the upper metal interconnection 134, or may be transmitted to the first through silicon via pad 202 through another portion of the upper metal interconnection 134, or by other known connections.

Referring to FIG. 1, a width of the first through silicon via 200 may be smaller than a width of the first through silicon via pad 202. That is to say, when viewed from a plan view or from a lateral surface of the first through silicon via 200, the first through silicon via 200 may be arranged within the first through silicon via pad 202. The width of the first through silicon via pad 202 may be larger than the width of the first through silicon via 200, so that a contact may be easily aligned with the first through silicon via pad 202 from the upper metal interconnection 134 positioned on the first through silicon via pad 202. In such a manner, the first through silicon via 200 and the upper metal interconnection 134 can be electrically connected in a stable manner. In addition, a plurality of contacts may be formed connected to one of the first through silicon via pad 202 and the upper metal interconnection 134, thereby forming a plurality of upper metal interconnections 134 that can be branched from the first through silicon via 200.

Referring to FIG. 1, a first width w1 of the first through silicon via pad 202 may be smaller than or equal to a second width w2 of the device isolation film 110. In order to electrically insulate the first through silicon via pad 202 from the substrate 100, the first through silicon via pad 202 may entirely overlap (that is, may be confined within) an area of the first device isolation film 110 and/or the interlayer insulating film 120 in plan view.

The first through silicon via pad 202 may be formed on the first device isolation film 110. The first through silicon via pad 202 may be positioned on the device isolation film 110 with the interlayer dielectric film 120 interposed between the first through silicon via pad 202 and the device isolation film 110. In other words, only the interlayer dielectric film 120 may be formed between the first device isolation film 110 and the first through silicon via pad 202. Device patterns protruding from the substrate 100 and the first device isolation film 110 may not be formed under or directly below the first through silicon via pad 202, such that an area of the first device isolation film 110 and/or the interlayer insulating film 120 between the TSV pad 202 and the substrate 100 is free of such device patterns (or other electrical components).

Only the interlayer dielectric film 120 and the first device isolation film 110 are positioned between the first through silicon via pad 202 and the substrate 100, but other circuit patterns are not positioned therebetween. As the interlayer dielectric film 120 and the first device isolation film 110 are made of insulating materials, the first through silicon via pad 202 and the substrate 100 are electrically insulated from each other. In other words, the first through silicon via pad 202 is confined within an area of the interlayer dielectric layer 120 and/or an area of the device isolation layer 110 that electrically insulates the first through silicon via pad 202 from the substrate 100. Therefore, since there is no leakage current path between the first through silicon via pad 202 and the substrate 100, the leakage current due to the first through silicon via pad 202 may be reduced or eliminated. In such a manner, electrical reliability of the semiconductor device 1 can be improved.

The first dummy device patterns 208 arranged around the first device isolation film 110 do not overlap the first through silicon via pad 202 in plan view. Since the first dummy device patterns 208 do not overlap the first through silicon via pad 202, the first through silicon via pad 202 and the substrate 100 may be electrically insulated from each other by the portion or area of the interlayer dielectric layer 120 and/or device isolation layer 110 extending therebetween. In such a manner, electrical reliability of the semiconductor device 1 can be improved.

Referring to FIG. 1, a first thickness of the first through silicon via pad 202 and a second thickness of the bottommost metal interconnection 132 formed at the same level as the first through silicon via pad 202 may be different from each other. The first thickness of the first through silicon via pad 202 contacting the first through silicon via 200 may be greater than the second thickness of the bottommost metal interconnection 132. Here, the term "thickness" is used to mean an average thickness of an element but is not used to mean a thickness of a specific portion of the element. A thickness of the first through silicon via pad 202 may mean an average thickness of the first through silicon via pad 202.

In detail, the first through silicon via pad 202 may be formed after forming the first through silicon via 200. After forming the interlayer dielectric film 120, the first throughhole 200t is formed and filled with a conductive material to form the first through silicon via 200. In order to form the first through silicon via pad 202, an inter-metal insulation film formed directly on the interlayer dielectric film 120 is patterned. When patterning the inter-metal insulation film, peripheral regions of the first through silicon via 200 and the first through silicon via 200 may be over-etched. As a result, the first through silicon via pad 202 may be recessed into the interlayer dielectric film 120. An extent of overetching of the inter-metal insulation film for forming the first through silicon via pad 202 may vary according to the shape of the first through silicon via pad 202. For example, the extent of overetching of the inter-metal insulation film for forming the first through silicon via pad 202 may vary according to whether the first through silicon via pad 202 has a plate shape, as shown in FIG. 3A, or a line shape, as shown in FIG. 3B.

Referring to FIG. 1, the lateral surface or cross-sectional area of the first through silicon via pad 202 may not be shaped as a rectangle in some embodiments. For example, in cross-section, the first through silicon via pad 202 may have a surface contacting the first through silicon via 200, the surface being inwardly recessed into the first through silicon via pad 202. The shape of the first through silicon via pad 202 will be described in detail with reference to FIG. 2.

Referring to FIGS. 1 and 2, the surface of the first through silicon via pad 202 contacting the first through silicon via 200 may be non-planar and may have a first spot or location 202-1 and a second spot or location 202-2 spaced at different distances from the first through silicon via 200. The first spot or location 202-1 and the second spot or location 202-2 may be positioned on one surface of the first through silicon via pad 202 contacting the first through silicon via 200. The first distance or range from the first through silicon via 200 to the first spot or location 202-1 may be denoted by d1, and the second distance or range from the first through silicon via 200 to the second spot or location 202-2 may be denoted by d2. When the first liner 204 is formed, the first distance d1 is a linear distance from the first throughhole 200t to the first spot or location 202-1, and the second distance d2 is a linear distance from the first throughhole 200t to the second spot or location 202-2.

A distance or range from the first surface 102 of the substrate 100 to the first spot or location 202-1 of the first through silicon via pad 202 may be referred to as a first height h1, and a distance or range from the first surface 102 of the substrate 100 to the second spot or location 202-2 of the first through silicon via pad 202 may be referred to as a second height h2. In detail, the first height h1 and the second height h2 are heights from the first device isolation film 110 to each of the first spot or location 202-1 and the second spot or location 202-2. The first height h1 ranging from the first surface 102 to the first spot or location 202-1 may be different from the second height h2 ranging from the first surface 102 to the second spot or location 202-2. In other words, the first spot or location 202-1 and the second spot or location 202-2 on the first through silicon via pad 202 having different minimum distances from the first through silicon via 200 are positioned at different heights from the first surface 102 of the substrate 100. Thus, a surface of the first through silicon via pad 202, contacting the first through silicon via 200, may not be planar.

Referring to FIG. 2, one surface of the first through silicon via pad 202 contacting the first through silicon via 200 may be recessed into the first through silicon via pad 202. The first height h1 of the first spot or location 202-1 may be smaller than the second height h2 of the second spot or location 202-2. In detail, the first height h1 of the first spot or location 202-1 (spaced from the first through silicon via 200 farther than second spot or location 202-2) is smaller than the second height h2 of the second spot or location 202-2.

The shape of the surface of the first through silicon via pad 202 contacting the first through silicon via 200 may be described by a fabricating method of the first through silicon via pad 202.

Referring to FIG. 1, the first throughhole 200t is formed after the interlayer dielectric film 120, and is filled to form the first through silicon via 200. In order to form the first through silicon via pad 202 contacting the first through silicon via 200, an inter-metal insulation film 130 including a first opening 202t exposing the first through silicon via 200 may be formed. During etching of the inter-metal insulation film 130 for forming the first opening 202t, the interlayer dielectric film 120 may also be etched. Here, portions of the interlayer dielectric film 120 spaced far apart or further from the first through silicon via 200 may be overetched more than portions of the interlayer dielectric film 120 formed around or surrounding the first through silicon via 200. Since the interlayer dielectric film 120 spaced far apart from the first through silicon via 200 is overetched more than the interlayer dielectric film 120 formed around or surrounding the first through silicon via 200, a bottom surface of the first opening 202t may have a gently protruding shape.

The first opening 202t having the gently protruding bottom surface is filled with a conductive material to form the first through silicon via pad 202. Since the shape of the surface of the first through silicon via pad 202 contacting the first through silicon via 200 is determined according to the shape of the bottom surface of the first opening 202t, one surface of the first through silicon via pad 202 contacting the first through silicon via 200 may have a shape inwardly recessed into the first through silicon via pad 202.

However, an extent of overetching of the interlayer dielectric film 120 for forming the first opening 202t may vary according to the shape of the first through silicon via pad 202. Therefore, the surface of the first through silicon via pad 202 contacting the first through silicon via 200 is not limited to that illustrated herein, that is, the shape of the first TSV pad 202 is not limited to the inwardly recessed shape.

In FIG. 3A, a first liner (204 of FIG. 1) formed on sidewalls of the first through silicon via 200 is not shown.

Referring to FIG. 3A, a first device isolation film 110 and a second device isolation film 112 may be formed in the substrate 100. The first device isolation film 110 may be surrounded by the second device isolation film 112. The first dummy source and drain regions 114 shaped of lattices arranged at regular intervals may be formed in the second device isolation film 112. The first device isolation film 110 is surrounded by the first dummy source and drain regions 114 arranged at regular intervals, and the second device isolation film 112 partitions or separates the first dummy source and drain regions 114.

The first device isolation film 110 and the second device isolation film 112 may be formed at the same level. That is to say, trenches are formed in potential regions of the first device isolation film 110 and the second device isolation film 112 and then filled with the same or different insulating materials, thereby forming the first device isolation film 110 and the second device isolation film 112.

Since first dummy device patterns 208 are formed on the first dummy source and drain regions 114, they may also be arranged at regular intervals, like the first dummy source and drain regions 114.

In some embodiments of the present inventive concept, there may be no electrical components or portions thereof overlapping the first through silicon via pad 202 contacting the first through silicon via 200, except for the first device isolation film 110 and the first through silicon via 200. In other words, the first through silicon via pad 202 is confined within an area of the interlayer dielectric layer 120 and/or an area of the device isolation layer 110 that is free of electrical components, such as the device patterns 208. Since the first dummy device patterns 208 and other device patterns are not formed under the first through silicon via pad 202, a leakage current path may not be formed between the first through silicon via pad 202 and the substrate 100.

The first through silicon via pad 202 may have, for example, a rectangular shape, but aspects of the present inventive concept are not limited thereto. A size of the first device isolation film 110 may be greater than that of the first through silicon via pad 202. For example, the first through silicon via pad 202 may entirely overlap or be confined within an area of the first device isolation film 110 in plan view. The first through silicon via 200 may be formed to penetrate the inside of or extend through the first device isolation film 110. The first through silicon via 200 may be positioned at or near the center of the first through silicon via pad 202, but aspects of the present inventive concept are not limited thereto. The first through silicon via 200 may entirely overlap the first through silicon via pad 202 in plan view.

The first through silicon via pad 202 may be physically separated from the bottommost metal interconnection 132 formed at the same level as the first through silicon via pad 202, but may be electrically connected thereto by a metal interconnection formed on the first through silicon via pad 202. In the fabricating process of the first through silicon via pad 202 and the bottommost metal interconnection 132, the first through silicon via pad 202 and the bottommost metal interconnection 132 may not be physically connected to each other.

Referring to FIG. 3B, the first through silicon via pad 202 may be shaped as a line extending lengthwise in one direction. In addition, a portion of the first through silicon via pad 202 may include a portion exposing or otherwise not overlapping the first through silicon via 200 in plan view. The first through silicon via pad 202a may be formed on the first device isolation film 110 in plurality. For convenience, two first through silicon via pads 202a are shown in the illustrated embodiment, but aspects of the present inventive concept are not limited thereto. Even if the first through silicon via pad 202a includes a plurality of first through silicon via pads, the first through silicon via pads 202a may entirely overlap or be confined within an area of the first device isolation film 110 in plan view.

The first through silicon via 200 may overlap a portion of the first through silicon via pad 202a. In particular, in plan view, only a portion of the first through silicon via 200 formed to penetrate the first device isolation film 110 may be covered by the first through silicon via pad 202a, leaving a portion thereof exposed.

Referring to FIGS. 1 and 3A, in the first region A, devices may not be formed in a region overlapping or under the first through silicon via pad 202 formed in the first region A, while devices may be formed in a region not overlapping or otherwise not under the first through silicon via pad 202.

A semiconductor device according to other embodiments of the present inventive concept will now be described with reference to FIG. 4. Since the embodiment of FIG. 4 is substantially the same as the embodiment of FIG. 1, except that a dummy device pattern is formed on a first device isolation film, the same functional components as those of the previous embodiment are denoted by the same reference numerals and detailed descriptions thereof will be briefly made or will be omitted.

Figure 4:
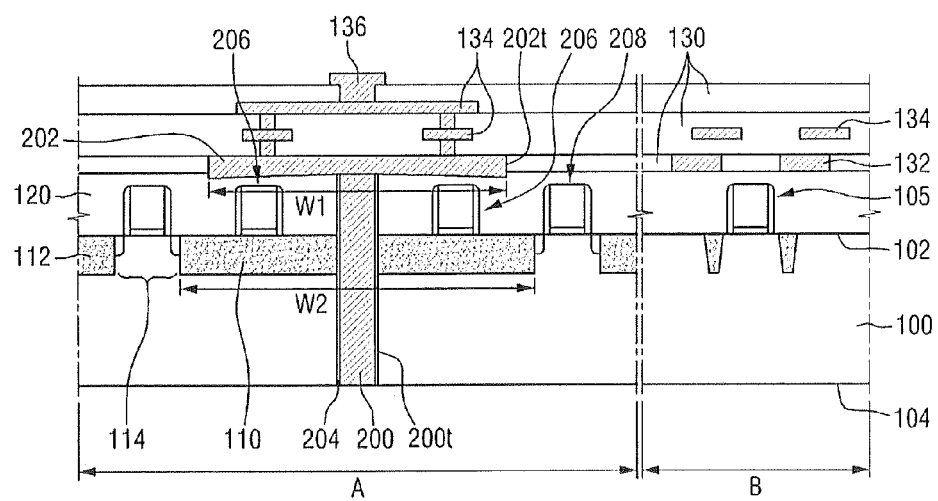
FIG. 4 is a cross-sectional view illustrating a semiconductor device according to other embodiments of the present inventive concept.
Figure 5:
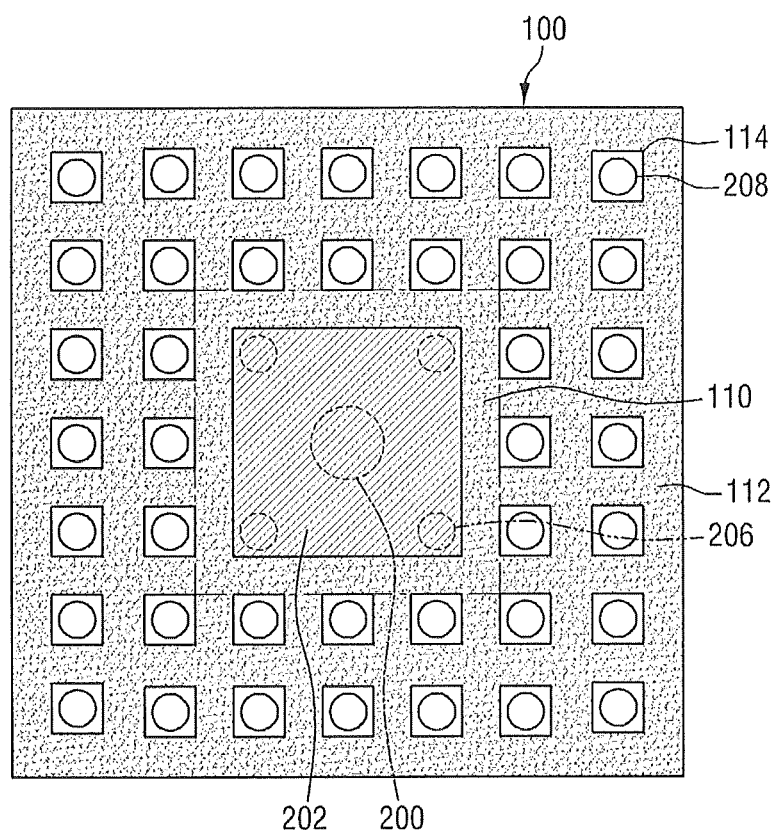
FIG. 5 is a layout or plan view of a first region (A) of FIG. 4.

FIG. 4 is a view illustrating a semiconductor device according to other embodiments of the present inventive concept and FIG. 5 is a layout or plan view of a first region (A) of FIG. 4.

Referring to FIG. 4, the semiconductor device 2 may include a substrate 100, a first device isolation film 110, an interlayer dielectric film 120, first dummy device patterns 208, second dummy device patterns 206, a first through silicon via 200 and a first through silicon via pad 202.

The second dummy device patterns 206 may be formed between the first device isolation film 110 and the first through silicon via pad 202. The second dummy device patterns 206 may be in an electrically floating state.

The second dummy device patterns 206 may be formed in at least one side of the first through silicon via 200. The second dummy device patterns 206 may be formed on a top surface of the first device isolation film 110 and may be separated from the first through silicon via pad 202 by the interlayer dielectric film 120. Since there is no exposed region of the substrate 100 below the second dummy device patterns 206 due to the device isolation film 110, a channel region or source and drain regions, for example, are not defined and the second dummy device patterns 206 are electrically insulated from the substrate.

In the embodiment of FIG. 4, the second dummy device patterns 206 may be gate patterns of a transistor, but aspects of the present inventive concept are not limited thereto. That is to say, a device pattern protruding from the substrate 100 or the top surface of the first device isolation film 110 may be second dummy device patterns 206.

The second dummy device patterns 206 include a dummy gate insulation film and a dummy gate electrode sequentially stacked. Since the dummy gate electrode is made of, for example, a conductive material, it may become a current path. Due to a processing margin, the first through silicon via pad 202 may contact the second dummy device patterns 206 and leakage current may flow from the first through silicon via pad 202 to the second dummy device patterns 206. However, since the second dummy device patterns 206 are formed on the electrically insulated first device isolation film 110, it is possible to prevent the current derived from the first through silicon via pad 202 from flowing to the substrate 100.

That is to say, the second dummy device patterns 206 are formed between the first through silicon via pad 202 and the substrate 100, while the second dummy device patterns 206 are formed on the first device isolation film 110 and electrically isolated from the substrate 100 thereby. Therefore, a leakage current path is not created between the first through silicon via pad 202 and the substrate 100.

In FIG. 4, the first through silicon via pad 202 and the second dummy device patterns 206 are spatially separated from each other, but aspects of the present inventive concept are not limited thereto. As described above, the first through silicon via pad 202 and the second dummy device patterns 206 may contact each other in some embodiments.

In FIG. 5, a first liner (204 of FIG. 4) formed on sidewalls of the first through silicon via 200 is not shown.

Referring to FIG. 5, second dummy device patterns 206 may be formed on the first device isolation film 110. In the illustrated embodiment, the second dummy device patterns 206 are formed adjacent corners of the first device isolation film 110, which is, however, provided only for illustration, but aspects of the present inventive concept are not limited thereto.

The second dummy device patterns 206 is covered by the first through silicon via pad 202 and may be entirely overlapped with the first through silicon via pad 202.

The second dummy device patterns 206 may be formed to be aligned with the first dummy device pattern 208 arranged in a lattice shape, but aspects of the present inventive concept are not limited thereto.

Since the other components shown in FIG. 5 are substantially the same as those shown in FIG. 3, detailed descriptions thereof will be omitted.

A semiconductor device according to still other embodiments of the present inventive concept will now be described with reference to FIG. 6. Since the embodiment of FIG. 6 is substantially the same as the embodiment of FIG. 1, except that a dummy source and drain regions are formed directly below a through silicon via pad, the same functional components as those of the previous embodiment are denoted by the same reference numerals and detailed descriptions thereof will be briefly made or will be omitted.

Figure 6:
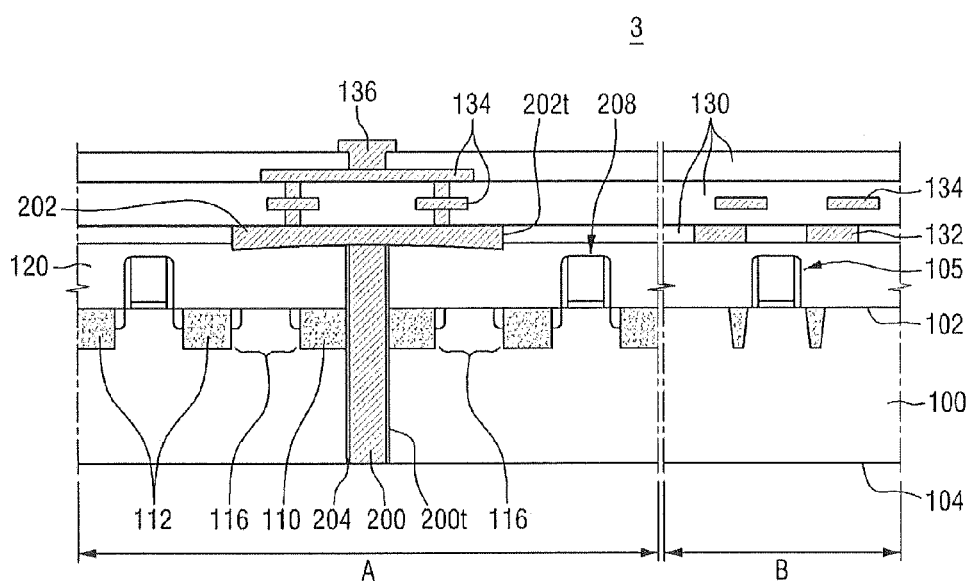
FIG. 6 is a cross-sectional view illustrating a semiconductor device according to still other embodiments of the present inventive concept.
Figure 7:
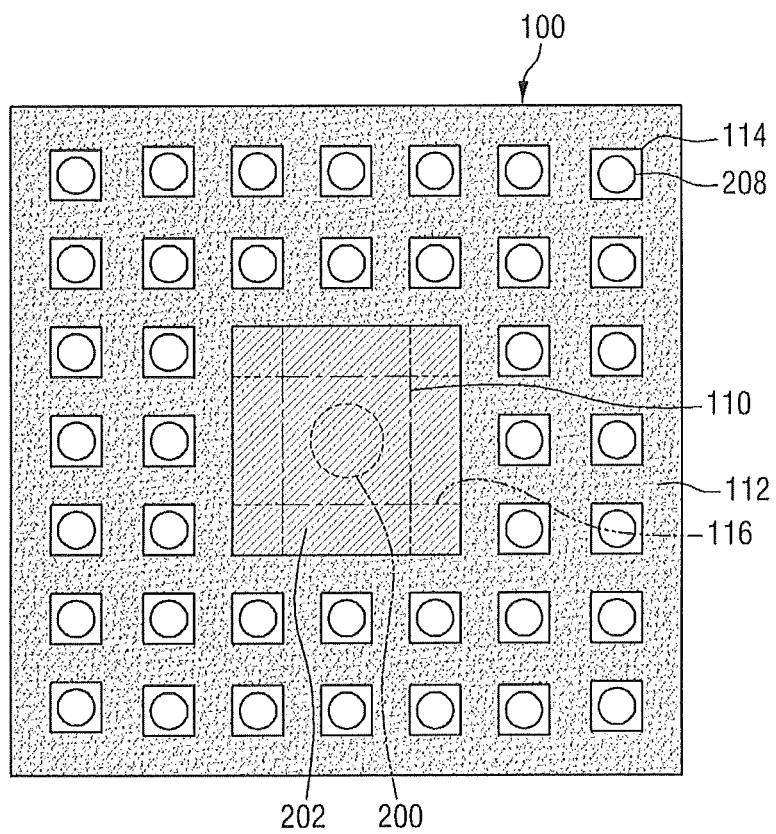
FIG. 7 is a layout or plan view of a first region (A) of FIG. 6.

FIG. 6 is a view illustrating a semiconductor device according to a third embodiment of the present inventive concept and FIG. 7 is a layout or plan view of a first region (A) of FIG. 6.

Referring to FIG. 6, the semiconductor device 3 may include a substrate 100, a first device isolation film 110, first dummy device patterns 208, a second dummy source and drain region (also referred to herein as a source/drain region) 116, an interlayer dielectric film 120, a first through silicon via 200 and a first through silicon via pad 202.

The second dummy source and drain region 116 may be formed between the first device isolation film 110 and the second device isolation film 112. Impurities (different from or opposite in conductivity type than impurities doped into the substrate 100) are doped into the second dummy source and drain regions 116, thereby forming a source and drain. The second dummy source and drain region 116 may overlap the first through silicon via pad 202 such that the second dummy source/drain regions 116 are under or beneath the first through silicon via pad 202 in plan view, but are electrically insulated therefrom by the area or portion of the interlayer dielectric film 120 therebetween.

The first dummy source and drain regions 114 and the second dummy source and drain region 116 may be the same in that they are formed between the first device isolation film 110 and the second device isolation film 112. However, the first dummy source and drain regions 114 and the second dummy source and drain region 116 may be different from each other in that the first dummy source and drain regions 114 do not overlap the first through silicon via pad 202 while the second dummy source and drain region 116 overlaps the first through silicon via pad 202 in plan view.

In the embodiment of FIG. 6, the second dummy source and drain region 116 may entirely overlap or be confined within an area of the first through silicon via pad 202 in plan view, but aspects of the present inventive concept are not limited thereto.

Device patterns protruding from the substrate 100 may not be formed on the second dummy source and drain region 116 formed below or under the first through silicon via pad 202. That is to say, the interlayer dielectric film 120 may be formed directly on the second dummy source and drain regions 116 and device patterns may not be formed thereon so as to insulate the second dummy source and drain regions 116 from the first through silicon via pad 202.

Referring to FIG. 7, the second dummy source and drain region 116 may be formed below/under/beneath the first through silicon via pad 202. The second dummy source and drain region 116 is formed at a boundary or edge portion of the first device isolation film 110, specifically adjacent corners of the first device isolation film 110, which is, however, provided only for illustration, but aspects of the present inventive concept are not limited thereto.

Since the second dummy source and drain regions 116 are covered by the first through silicon via pad 202, they may entirely overlap or be confined within an area of the first through silicon via pad 202 in plan view in some embodiments.

The second dummy source and drain region 116 may be formed to be aligned with the first dummy source and drain regions 114 arranged in a lattice shape, but aspects of the present inventive concept are not limited thereto.

A semiconductor device according to yet other embodiments of the present inventive concept will now be described with reference to FIG. 8.

Figure 8:
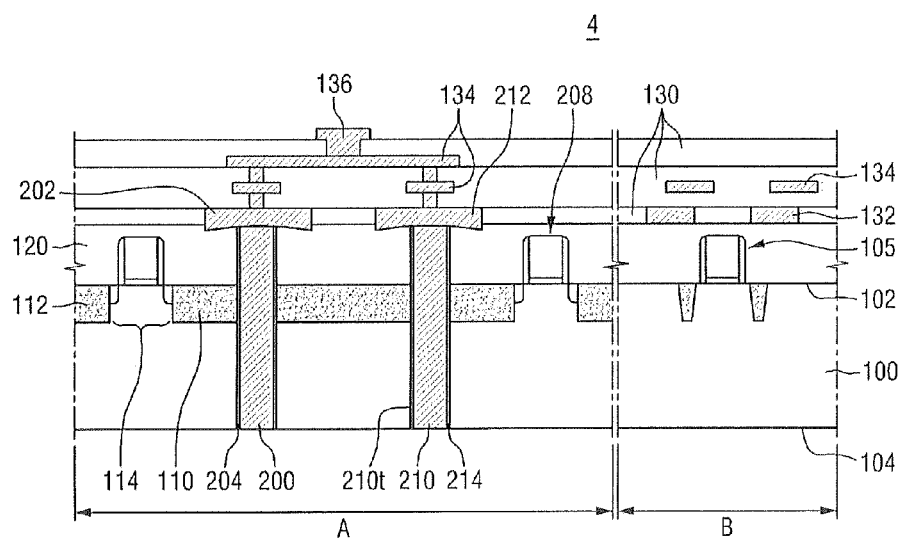
FIG. 8 is a cross-sectional view illustrating a semiconductor device according to yet other embodiments of the present inventive concept.

FIG. 8 is a view illustrating a semiconductor device according to yet other embodiments of the present inventive concept.

Referring to FIG. 8, the semiconductor device 4 may include a substrate 100, a first device isolation film 110, first dummy device patterns 208, an interlayer dielectric film 120, a first through silicon via 200, a first through silicon via pad 202, a second through silicon via 210, and a second through silicon via pad 212.

The first through silicon via 200 and the second through silicon via 210 may be formed to penetrate the substrate 100, the first device isolation film 110 and the interlayer dielectric film 120, respectively. The first through silicon via pad 202 and the second through silicon via pad 212 may be formed to contact the first through silicon via 200 and the second through silicon via 210, respectively. The first through silicon via 200 and the second through silicon via 210 are formed to be adjacent to each other. While the first through silicon via pad 202 and the second through silicon via pad 212 are formed to be adjacent to each other, they may be separated from each other by the inter-metal insulation film 130. The first through silicon via pad 202 and the second through silicon via pad 212 are formed at the same level as the bottommost metal interconnection 132. The first through silicon via pad 202 and the second through silicon via pad 212 may not be physically or electrically connected to each other by the bottommost metal interconnection 132 formed at the same level. Since details of configurations and positions of the second through silicon via 210 and the second through silicon via pad 212 are substantially the same as those of the first through silicon via 200 and the first through silicon via pad 202, detailed descriptions thereof will be omitted.

Referring to FIG. 8, the first through silicon via pad 202 and the second through silicon via pad 212 may be electrically connected to each other. While the first through silicon via pad 202 and the second through silicon via pad 212 are physically disconnected or separated from each other, they may be electrically connected by the upper metal interconnection 134. For example, the first through silicon via pad 202 and the second through silicon via pad 212 may be electrically connected to each other by the upper metal interconnection 134 formed directly on the first through silicon via pad 202 and the second through silicon via pad 212.

The first through silicon via 200 and the second through silicon via 210 formed to be adjacent to each other may be used as, for example, power lines for supplying power to the semiconductor device 3, but aspects of the present inventive concept are not limited thereto.

In FIG. 8, the first through silicon via pad 202 and the second through silicon via pad 212 are formed to contact the first through silicon via 200 and the second through silicon via 210, respectively, but aspects of the present inventive concept are not limited thereto. That is to say, the first through silicon via pad 202 and the second through silicon via pad 212 may not be independently formed, but may be formed as a single through silicon via pad commonly contacting both the first through silicon via 200 and the second through silicon via 210.

In the embodiment of FIG. 8, the second dummy device patterns are not formed on a top surface of the first device isolation film 110, but aspects of the present inventive concept are not limited thereto. That is to say, as shown in FIG. 4, the second dummy device patterns 206 may be formed between the first through silicon via 200 and the second through silicon via 210, and may be formed on the first device isolation film 110 formed adjacent to the first dummy device pattern 208 such that the second dummy device patterns 206 are between the substrate 100 and the first and second through silicon via pads 202 and 212.

Figure 9:
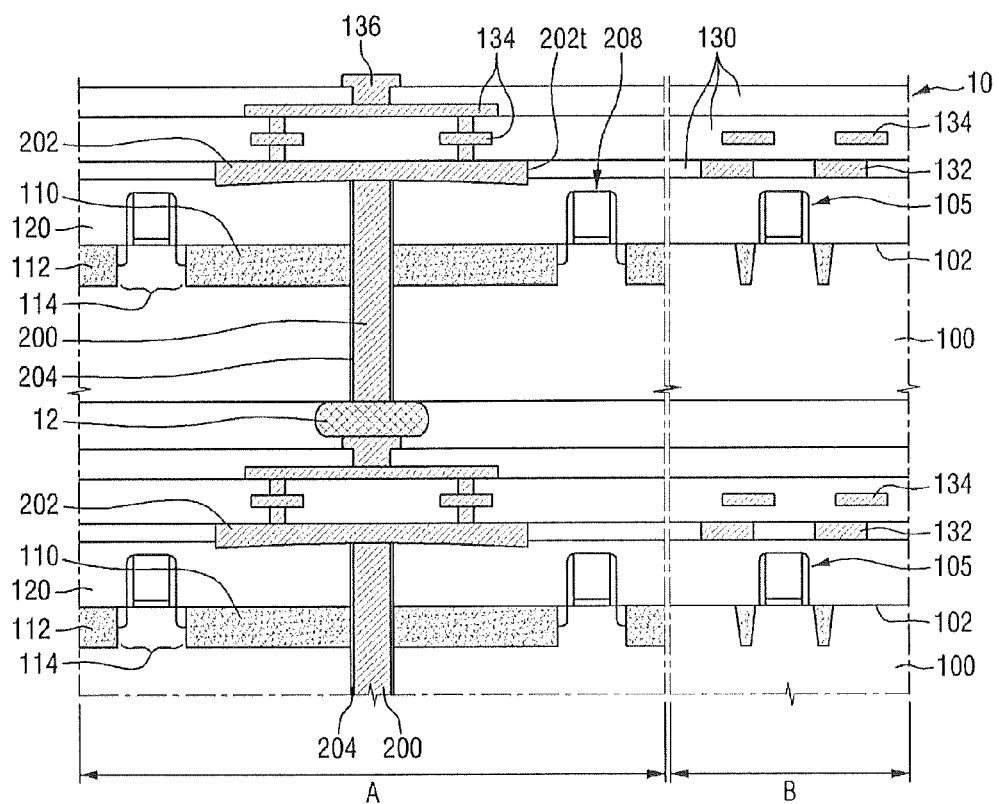
FIG. 9 is a cross-sectional illustrating semiconductor devices according to embodiments of the present inventive concept are stacked using a through-electrode.

FIG. 9 illustrates that semiconductor devices according to embodiments of the present inventive concept are stacked using a through-electrode.

The stacked semiconductor devices will be referred to as first semiconductor chips 10.

Referring to FIG. 9, a plurality of first semiconductor chips 10 are stacked and the plurality of first semiconductor chips 10 may be electrically connected to each other by means of a conductive bump 12. In detail, a conductive pad 136 positioned in the lower semiconductor chip and a through silicon via 200 positioned in the upper semiconductor chip may be electrically connected to each other by the conductive bump 12.

The semiconductor chips 10 may be modified to include one or more of the semiconductor devices 2, 3 and 4 shown in FIGS. 4, 6 and 8. As shown in FIG. 9, the plurality of first semiconductor chips 10 may be stacked on a mounting substrate using a through-electrode, thereby fabricating a semiconductor package.

Figure 10:
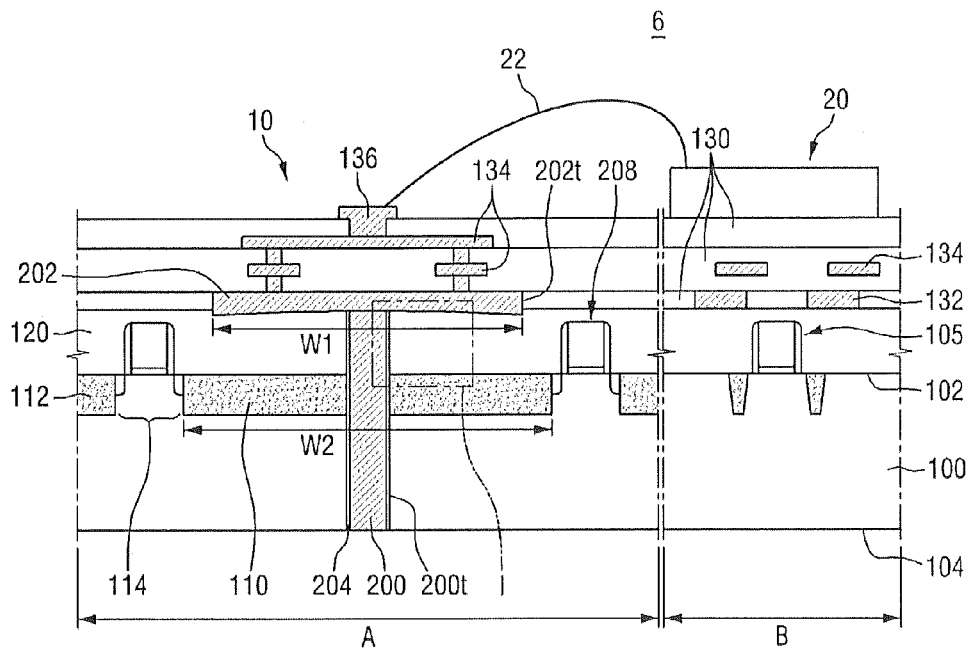
FIG. 10 is a cross-sectional illustrating that semiconductor chips including semiconductor devices according to embodiments of the present inventive concept connected by wire bonding.

FIG. 10 illustrates that semiconductor chips including semiconductor devices according to embodiments of the present inventive concept are stacked.

Referring to FIG. 10, a second semiconductor chip 20 may be stacked on a first semiconductor chip 10 including a through silicon via 200. The first and second semiconductor chips 10 may be connected to each other through the conductive pad 136 formed in the second semiconductor chip 20 and a wiring 22 formed in the first semiconductor chips 10.

The first semiconductor chip 10 and the second semiconductor chip 20 may be products of the same kind or different kinds. In addition, the first semiconductor chip 10 may be modified to include one or more of the semiconductor devices 2, 3 and 4 shown in FIGS. 4 to 6.

Figure 11:
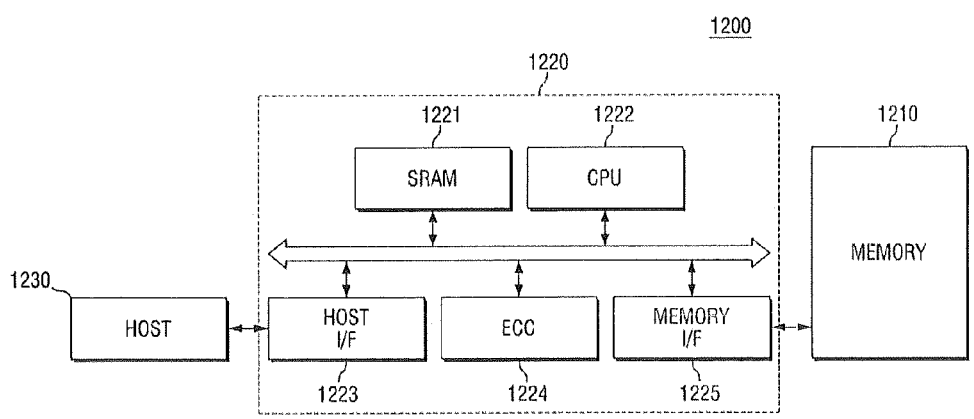
FIG. 11 is a block diagram of a memory card including semiconductor devices according to some embodiments of the present inventive concept.

FIG. 11 is a block diagram of a memory card including semiconductor devices according to some embodiments of the present inventive concept.

Referring to FIG. 11, a memory 1210 including semiconductor devices manufactured according to various embodiments of the present inventive concept may be employed in a memory card 1200. The memory card 1200 may include a memory controller 1220 that controls data exchange between a host 1230 and the memory 1210. A static random access memory (SRAM) 1221 may be used as an operation memory of a central processing unit (CPU) 1222. A host interface (I/F) 1223 may include a protocol to allow the host 1230 to access the memory card 1200 for data exchange. An error correction code unit (ECC) 1224 may detect an error of data read from the memory 1210 and may correct the detected error. The memory I/F 1225 may interface with the memory 1210. The CPU 1222 may perform the overall control operations associated with data exchange of the memory controller 1220.

Figure 12:
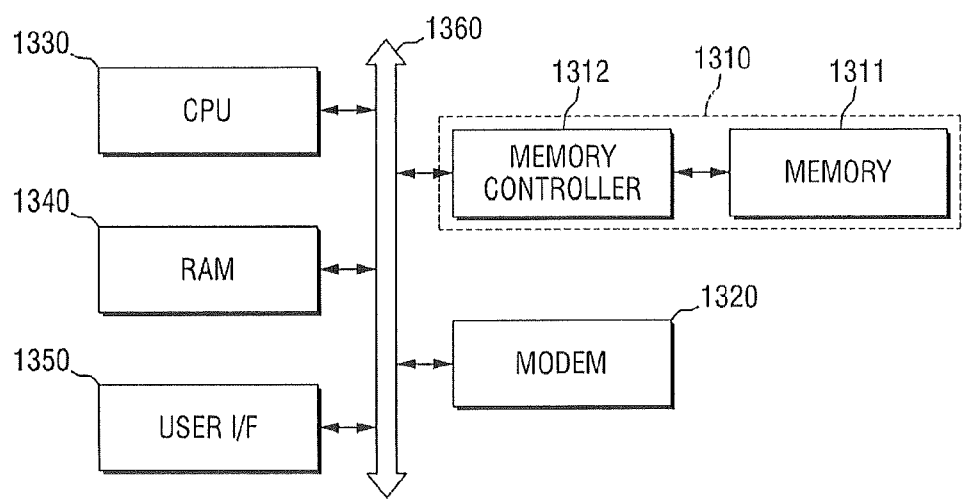
FIG. 12 is a block diagram of an information processing system using semiconductor devices according to some embodiments of the present inventive concept.

FIG. 12 is a block diagram of an information processing system using semiconductor devices according to some embodiments of the present inventive concept.

Referring to FIG. 12, an information processing system 1300 may include a memory system 1310 including semiconductor devices manufactured according to various embodiments of the present inventive concept. The information processing system 1300 may include the memory system 1310 electrically connected to a system bus 1360, a modem 1320, a CPU 1330, a RAM 1340 and a user interface (I/F) 1350. The memory system 1310 may include a memory 1311 and a memory controller 1312 and may have substantially the same configuration as the memory card 1200 shown in FIG. 9. The data processed by the CPU 1330 or data received from an external device may be stored in the memory system 1310. The information processing system 1300 may be employed in a memory card, a solid state drive (SSD), a camera image sensor, and/or various chip sets. For example, the memory system 1310 may be configured to be employed in a SSD. In this case, the information processing system 300 may process large capacity data in a stable and reliable manner.

Figure 13:
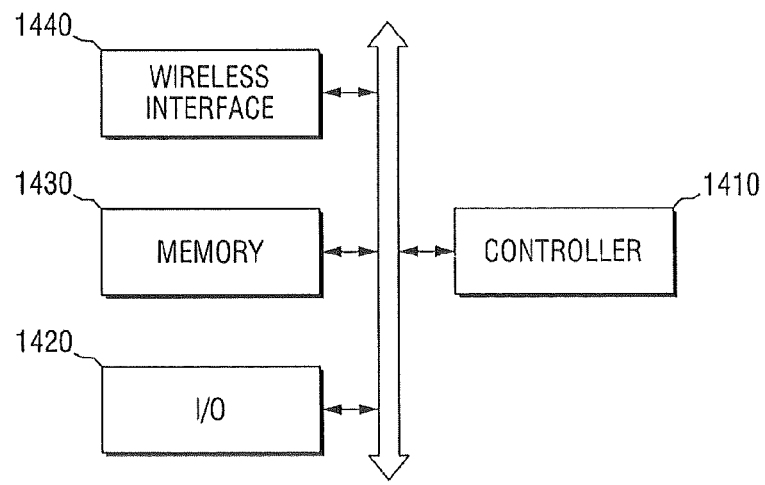
FIG. 13 is a block diagram of an electronic device including semiconductor devices according to some embodiments of the present inventive concept.

FIG. 13 is a block diagram of an electronic device including semiconductor devices according to some embodiments of the present inventive concept.

Referring to FIG. 13, an electronic device 1400 may include semiconductor devices manufactured according to various embodiments of the present inventive concept. The electronic device 1400 may be used in a wireless communication device (for example, PDA, a notebook computer, a portable computer, a web tablet, a cordless phone, and/or a wireless digital music player) or various devices exchanging information in a wireless communication environment.

The electronic device 1400 may include a controller 1410, an input/output device (I/O) 1420, a memory 1430, and a wireless interface 1440. Here, the memory 1430 may include semiconductor devices manufactured according to various embodiments of the present inventive concept. The controller 1410 may include a microprocessor, a digital signal processor, or the like. The memory 1430 may be used to store commands (or user data) processed by the controller 1410. The wireless interface 1440 may be used to exchange data through a wireless data network. The wireless interface 1440 may include an antenna and/or a wireless transceiver. The electronic device 400 may use a third generation communication system protocol, such as CDMA, GSM, NADC, E-TDMA, WCDMA, or CDMA 2000.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. An integrated circuit device, comprising:
a substrate including a plurality of dummy device patterns in an electrically floating state thereon;
a device isolation layer on the substrate;
an interlayer dielectric layer on the device isolation layer and the substrate;
a conductive via extending through the interlayer dielectric layer and the device isolation layer and into the substrate; and
a conductive via contact pad on the conductive via and the interlayer dielectric layer,
wherein, in plan view, the conductive via contact pad overlaps with: at least one of the dummy device patterns that is electrically insulated from the substrate by a portion of the device isolation layer extending therebetween; or at least one dummy active region of the substrate that is electrically insulated from the conductive via contact pad by a portion of the interlayer dielectric layer continuously extending therebetween.

2. The device of claim 1, wherein the substrate comprises a device region having a plurality of device patterns thereon and a peripheral region having the plurality of dummy device patterns and the conductive via contact pad thereon, and wherein the dummy device patterns are adjacent a periphery of the conductive via contact pad.

3. The device of claim 2, wherein the conductive via contact pad contacts the at least one of the dummy device patterns that is electrically insulated from the substrate by the portion of the device isolation layer extending therebetween.

4. The device of claim 2, wherein an area of overlap between the conductive via contact pad and the interlayer dielectric layer is free of the dummy device patterns.

5. The device of claim 2, wherein a surface of the conductive via contact pad on the conductive via is recessed into the interlayer dielectric layer and is non-planar, and wherein the conductive via contact pad and a metal interconnection in the device region of the substrate that is electrically connected to the conductive via contact pad comprise portions of a same metal layer.

6. A semiconductor device comprising:
a substrate;
a device isolation film in the substrate;
an interlayer dielectric film on the device isolation film and the substrate;
a through silicon via (TSV) extending through the substrate, the device isolation film and the interlayer dielectric film;
a through silicon via pad on the interlayer dielectric film and contacting the through silicon via; and
a first dummy device pattern in the interlayer dielectric film and arranged adjacent a periphery of the through silicon via pad, the first dummy device pattern being in an electrically floating state,
wherein the substrate is not in contact with the interlayer dielectric film at an area of overlapping with the through silicon via pad.

7. The semiconductor device of claim 6, wherein the through silicon via pad entirely overlaps the device isolation film in plan view.

8. The semiconductor device of claim 6, wherein the first dummy device pattern does not overlap the through silicon via pad in plan view.

9. The semiconductor device of claim 6, further comprising a second dummy device pattern formed between the device isolation film and the through silicon via pad.

10. The semiconductor device of claim 6, further comprising a bottommost metal interconnection formed on the interlayer dielectric film, wherein the through silicon via pad is formed at a same level as the bottommost metal interconnection.

11. The semiconductor device of claim 10, wherein the through silicon via pad and the bottommost metal interconnection are spatially separated from each other.

12. The semiconductor device of claim 10, wherein the through silicon via pad has a thickness greater than that of the bottommost metal interconnection.

13. The semiconductor device of claim 6, wherein the through silicon via pad has a first location at a first distance from the through silicon via and a second location at a second distance from the through silicon via that is different from the first distance, and wherein a first height from the substrate to the first location is different from a second height from the substrate to the second location.

14. The semiconductor device of claim 13, wherein the first distance is greater than the second distance, and the first height is less than the second height.

15. A semiconductor device comprising:
a substrate;
a device isolation film in the substrate;
an interlayer dielectric film on the device isolation film and the substrate;
a through silicon via (TSV) extending through the substrate, the device isolation film and the interlayer dielectric film;
a through silicon via pad on the interlayer dielectric film and contacting the through silicon via; and
a dummy device pattern in the interlayer dielectric film and arranged adjacent a periphery of the through silicon via pad, the dummy device pattern being in an electrically floating state,
wherein the dummy device pattern does not overlap the through silicon via pad in plan view, and wherein the dummy device pattern protruding from the substrate and the device isolation film is not formed under the through silicon via pad.

16. The semiconductor device of claim 15, wherein the through silicon via pad entirely overlaps the device isolation film in plan view.

17. The semiconductor device of claim 15, further comprising dummy active regions formed in the substrate, wherein the dummy active regions overlap the through silicon via pad in plan view.

18. The semiconductor device of claim 15, further comprising a bottommost metal interconnection formed on the interlayer dielectric film, wherein the through silicon via pad is formed at a same level as the bottommost metal interconnection.

19. The semiconductor device of claim 18, wherein the through silicon via pad has a thickness greater than that of the bottommost metal interconnection.

20. The semiconductor device of claim 15, wherein the through silicon via pad has a first location at a first distance from the through silicon via and a second location at a second distance from the through silicon via that is different from the first distance, and wherein a first height from the substrate to the first location is less than a second height from the substrate to the second location.

* * * * *